United States Patent
Ishii et al.

(10) Patent No.: US 9,861,000 B2
(45) Date of Patent: Jan. 2, 2018

(54) VENTILATION STRUCTURE AND VENTILATION MEMBER

(71) Applicant: Nitto Denko Corporation, Ibaraki-shi, Osaka (JP)

(72) Inventors: Kyoko Ishii, Osaka (JP); Youzou Yano, Osaka (JP); Kouji Furuuchi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 57 days.

(21) Appl. No.: 14/903,504

(22) PCT Filed: Jul. 8, 2014

(86) PCT No.: PCT/JP2014/003621
§ 371 (c)(1),
(2) Date: Jan. 7, 2016

(87) PCT Pub. No.: WO2015/019544
PCT Pub. Date: Feb. 12, 2015

(65) Prior Publication Data
US 2016/0174397 A1    Jun. 16, 2016

(30) Foreign Application Priority Data
Aug. 9, 2013  (JP) .................. 2013-167050

(51) Int. Cl.
*H05K 5/02*    (2006.01)
*F21V 31/03*    (2006.01)
(Continued)

(52) U.S. Cl.
CPC ........... *H05K 5/0213* (2013.01); *F21V 31/03* (2013.01); *F24F 13/08* (2013.01); *H05K 7/20009* (2013.01); *F21S 48/332* (2013.01)

(58) Field of Classification Search
CPC ....... B01D 48/00; B01D 53/22; F21S 48/335; F21S 48/337; Y10S 55/30
(Continued)

(56) References Cited

U.S. PATENT DOCUMENTS 6,364,924 B1 * 4/2002 Mashiko ............... F21S 48/335
                                                            55/385.1
8,277,295 B2 * 10/2012 Yano ....................... H05K 5/068
                                                               361/694
(Continued)

FOREIGN PATENT DOCUMENTS

DE    3311252        10/1984
JP    43-017679 Y    7/1968
(Continued)

OTHER PUBLICATIONS

Office Action issued for corresponding Japanese Patent Application No. 2013-167050, dated Mar. 14, 2017, 12 pages including English translation.

(Continued)

*Primary Examiner* — Duane Smith
*Assistant Examiner* — Minh-Chau Pham
(74) *Attorney, Agent, or Firm* — Hamre, Schumann, Mueller & Larson, P.C.

(57) ABSTRACT

A ventilation structure (10A) includes a housing (50) having an opening portion (50a) and a ventilation member (1A) formed of a porous resin and attached to the housing (50) so as to cover the opening portion (50a). In the ventilation structure (10A), the ventilation member (1A) is fitted to a side surface (50d) of a projecting portion (50b) provided on an outer surface of a wall portion (50g) of the housing (50), with at least one of the projecting portion (50b) and the ventilation member (1A) being elastically deformed.

17 Claims, 9 Drawing Sheets

(51) Int. Cl.
*F24F 13/08* (2006.01)
*H05K 7/20* (2006.01)
*F21S 8/10* (2006.01)

(58) Field of Classification Search
USPC .......... 55/385.4, 385.1, 524, 527; 96/13, 14
See application file for complete search history.

(56) References Cited

U.S. PATENT DOCUMENTS

| | | | |
|---|---|---|---|
| 8,414,672 | B2 | 4/2013 | Furuyama et al. |
| 8,475,554 | B2 * | 7/2013 | Furuuchi ................. F21V 31/03 55/385.4 |
| 8,814,993 | B2 * | 8/2014 | Yano ..................... F21S 48/332 55/385.4 |
| 2008/0092741 | A1 | 4/2008 | Furuuchi et al. |
| 2009/0084078 | A1 * | 4/2009 | Furuyama ............. F21S 48/335 55/385.4 |
| 2009/0107090 | A1 * | 4/2009 | Keel .................. B01D 46/2407 55/385.4 |
| 2010/0175850 | A1 | 7/2010 | Kaucic et al. |
| 2011/0297698 | A1 | 12/2011 | Chiang et al. |

FOREIGN PATENT DOCUMENTS

| | | |
|---|---|---|
| JP | S4872151 U | 9/1973 |
| JP | 51-137496 | 11/1976 |
| JP | 63-186432 U | 11/1988 |
| JP | S63172195 U | 11/1988 |
| JP | 3-286489 | 12/1991 |
| JP | 2000-205098 | 7/2000 |
| JP | 2001-114339 | 4/2001 |
| JP | 2006190656 A | 7/2006 |
| JP | 2006-297200 | 11/2006 |
| JP | 2007-087666 | 4/2007 |
| JP | 2007-087929 | 4/2007 |

OTHER PUBLICATIONS

Extended European Search Report for corresponding European Patent Application No. 14835089.5, dated Mar. 10, 2017, 9 pages.
International Search Report issued in International Application No. PCT/JP2014/003621, dated Aug. 19, 2014, 4 pages.

* cited by examiner

VENTILATION STRUCTURE AND VENTILATION MEMBER

TECHNICAL FIELD

The present invention relates to a ventilation structure and a ventilation member used to reduce pressure variation in a housing or to allow replacement of air in the housing.

BACKGROUND ART

Conventionally, for example, in automobile electric components such as automobile lamps and ECUs (Electrical Control Units), OA (office automation) equipment, household electric appliances, and medical devices, a housing containing an electric component or a control board is provided with an opening for the purpose of reducing pressure variation in the housing caused by temperature change or allowing replacement of air in the housing, and a ventilation member is attached to the opening. The ventilation member ensures ventilation between the inside and outside of the housing, and also prevents foreign matters such as dust and water from entering the housing. Examples of such a ventilation member are disclosed in Patent Literatures 1 and 2.

Figure 10:
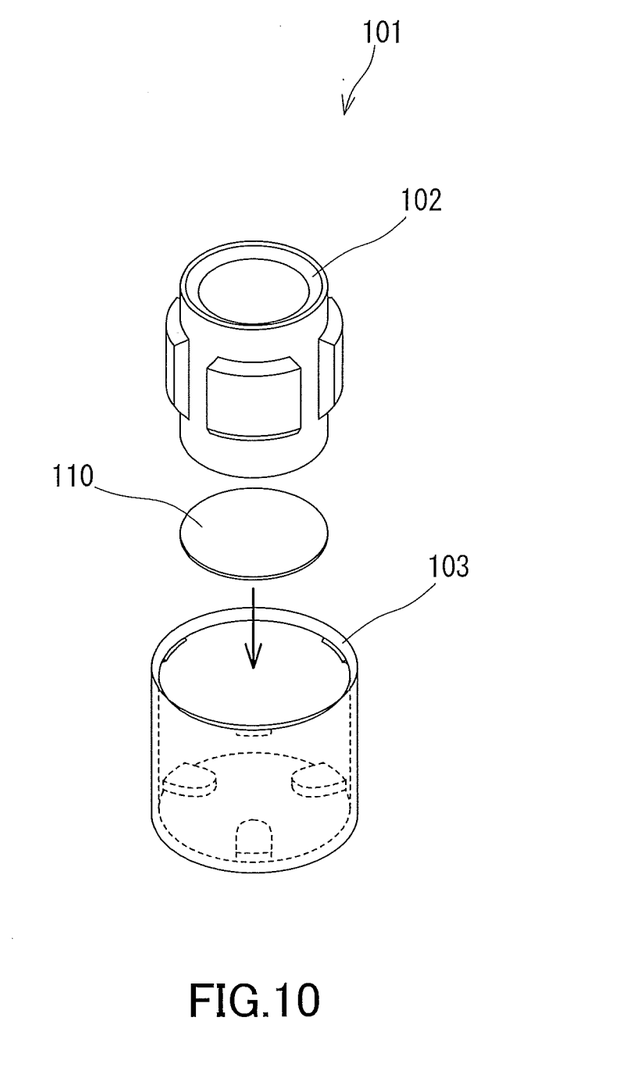
FIG. 10 is an exploded perspective view of a conventional ventilation member.
Figure 11:
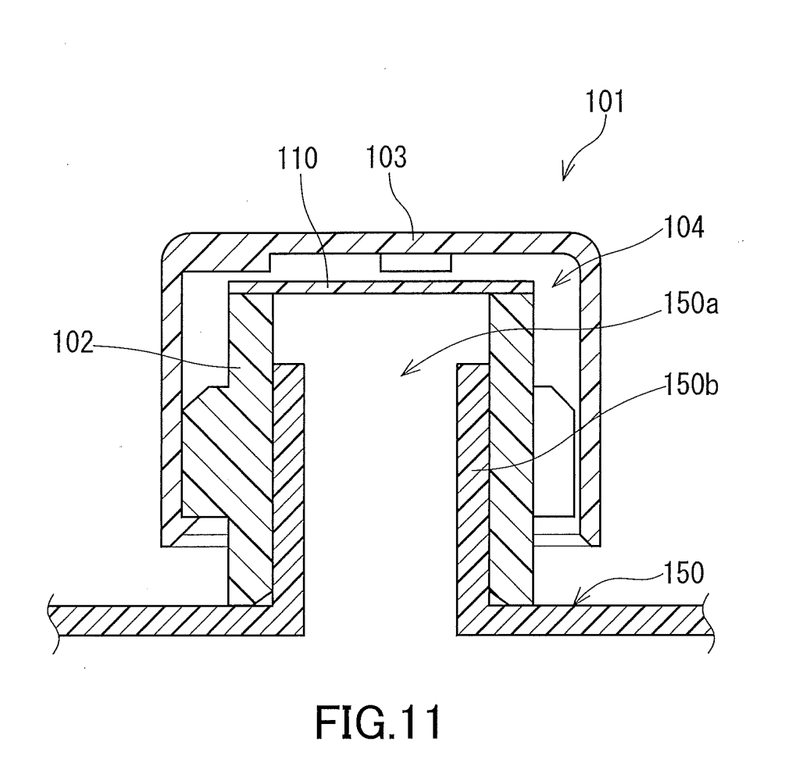
FIG. 11 is a cross-sectional view of the ventilation member shown in FIG. 10 attached to a housing.

For example, Patent Literature 1 discloses a ventilation member 101 as shown in FIG. 10 and FIG. 11. This ventilation member 101 is composed of a tubular body 102 made of rubber, a tubular cover component 103 having a bottom, and a gas-permeable membrane 110. The tubular body 102 has a slightly smaller diameter than the cover component 103, and the gas-permeable membrane 110 is disposed so as to close one opening of the tubular body 102. The tubular body 102 is fitted into the cover component 103 by inserting the portion of the tubular body 102 on the gas-permeable membrane 110 side into the cover component 103. Thus, a gas passage 104 is formed between the inner peripheral surface of the cover component 103 and the outer peripheral surface of the tubular body 102 and between the bottom surface of the cover component 103 and the gas-permeable membrane 110. The tubular body 102 made of elastically deformable rubber is press-fitted on a projecting portion 150b provided on the outer surface of the housing 150, and thus the ventilation member 101 can be attached to the housing 150 so as to cover the opening portion 150a of the housing 150.

Figure 12:
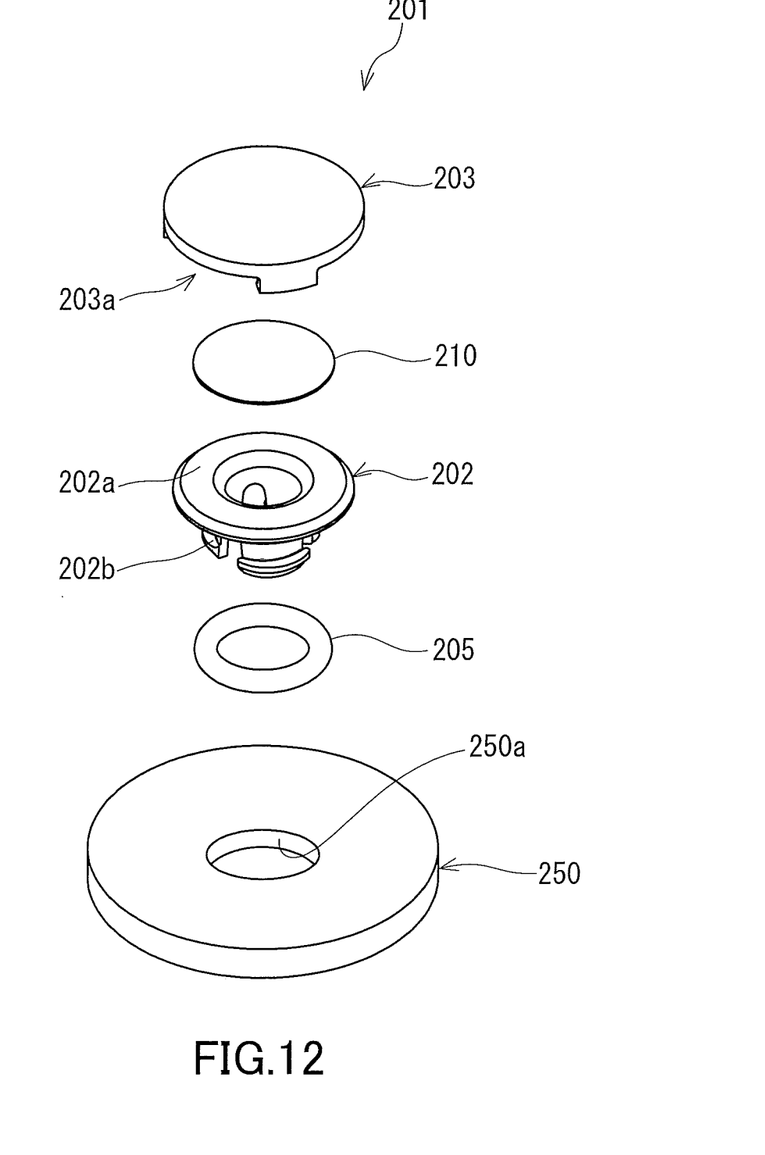
FIG. 12 is an exploded perspective view of another conventional ventilation member.
Figure 13:
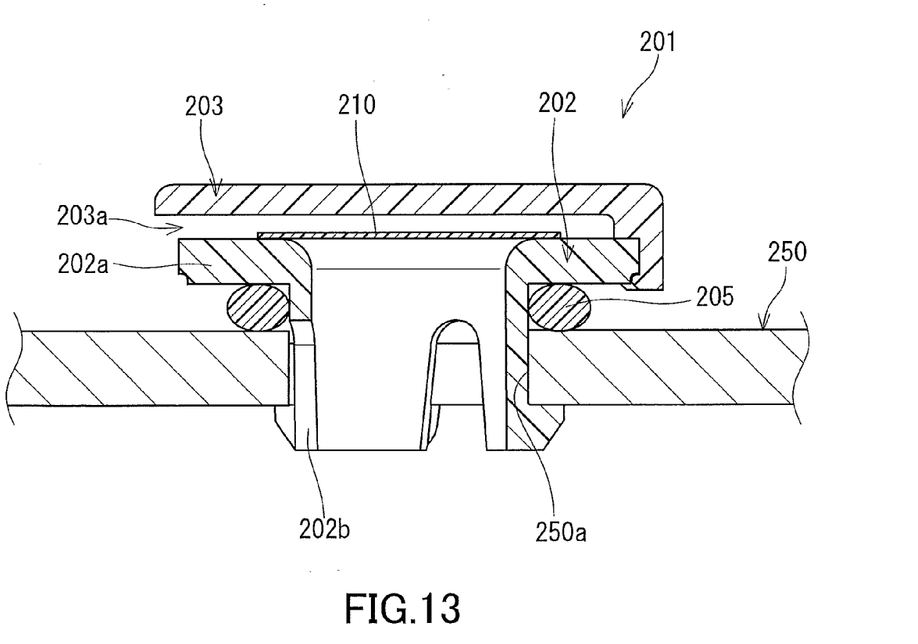
FIG. 13 is a cross-sectional view of the ventilation member shown in FIG. 12 attached to a housing.

As shown in FIG. 12 and FIG. 13, a ventilation member 201 disclosed in Patent Literature 2 includes a support body 202 on which a gas-permeable membrane 210 is disposed, and a cover component 203 fitted to the support body 202 so as to cover the gas-permeable membrane 210. A plurality of opening portions 203a are formed in the top or side of the cover component 203. A gas having permeated the gas-permeable membrane 210 passes through the opening portions 203a of the cover component 203, as a result of which ventilation between a space inside a housing 250 and a space outside the housing 250 can be ensured. The support body 202 has a base portion 202a and leg portions 202b extending from the base portion 202a. In this ventilation member 201, when the leg portions 202b are inserted into the opening portion 250a of the housing 250 via a sealing member 205, the leg portions 202b inserted in the opening portion 250a are elastically deformed to fix the ventilation member 201 to the housing 250. Conventionally, porous polytetrafluoroethylene (PTFE) membranes are often used as the gas-permeable membranes 110 and 210.

CITATION LIST

Patent Literature

Patent Literature 1: JP 2007-87929 A
Patent Literature 2: JP 2007-87666 A

SUMMARY OF INVENTION

Technical Problem

However, in the ventilation member 101 disclosed in Patent Literature 1, the tubular body 102 made of elastically deformable rubber needs to be provided as a separate body in order to attach the ventilation member 101 to the housing 150. In the ventilation member 201 disclosed in Patent Literature 2, the support body 202 needs to be provided with the elastically deformable leg portions 202b in order to attach the ventilation member 201 to the housing 250. Therefore, the number of processes for producing the components and the number of processes for assembling the components are increased, and the cost of producing the ventilation members is increased accordingly.

Since the ventilation member 101 and the ventilation member 201 each include a high proportion of gas-impermeable components 102 and 103 or 202, 203, and 205, these ventilation members 101 and 201 are not necessarily suitable for improving the gas permeability.

In view of such circumstances, the present invention aims to provide a ventilation structure and a ventilation member suitable for improving gas permeability and reducing production cost.

Solution to Problem

The present invention provides a ventilation structure including: a housing having an opening portion; and a ventilation member formed of a porous resin and attached to the housing so as to cover the opening portion. The ventilation member is fitted to a side surface of a wall portion of the housing facing the opening portion or to a side surface of a projecting portion provided on an outer surface of the wall portion, with at least one of the wall portion, the projecting portion, and the ventilation member being elastically deformed.

Another aspect of the present invention provides a ventilation member adapted to be attached to a housing so as to cover an opening portion of the housing. The ventilation member is formed of a porous resin and includes a contact surface. When the ventilation member is attached to the housing so as to cover the opening portion, the contact surface is in contact with a side surface of a wall portion of the housing facing the opening portion or with a side surface of a projecting portion provided on an outer surface of the wall portion, with at least one of the wall portion, the projecting portion, and the ventilation member being elastically deformed.

Advantageous Effects of Invention

In the ventilation member according to the present invention, a portion of the ventilation member adapted to be fitted to a portion (the side surface) of the housing is itself formed of a gas-permeable porous resin. Therefore, compared to the use of conventional ventilation members, the use of this ventilation member makes it possible to provide a ventilation structure suitable for improving gas permeability and reducing production cost.

DESCRIPTION OF EMBODIMENTS

Hereinafter, embodiments of the present invention will be described with reference to the accompanying drawings. The following description relates to illustrative examples of the present invention, and the present invention is not limited by these examples. Hereinafter, the same components as those described previously are denoted by the same reference numerals, and the description thereof is omitted in some cases.

First Embodiment

Figure 1:
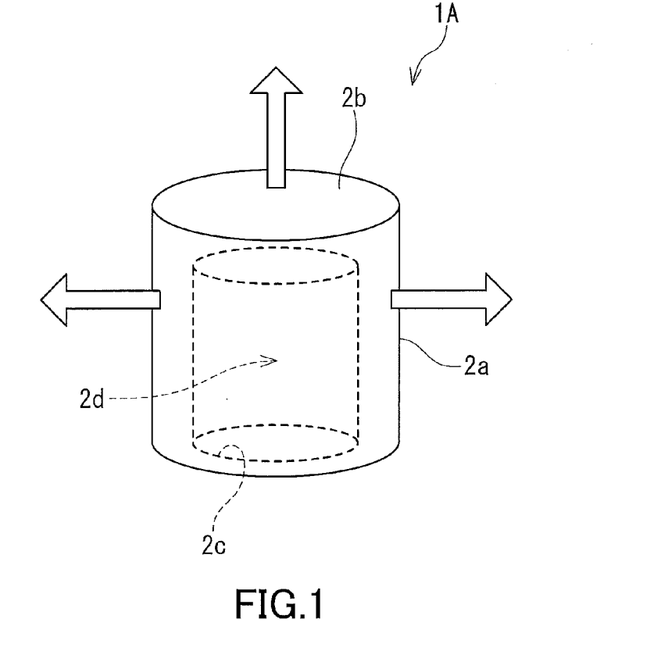
FIG. 1 is a perspective view of a ventilation member according to a first embodiment of the present invention.
Figure 2:
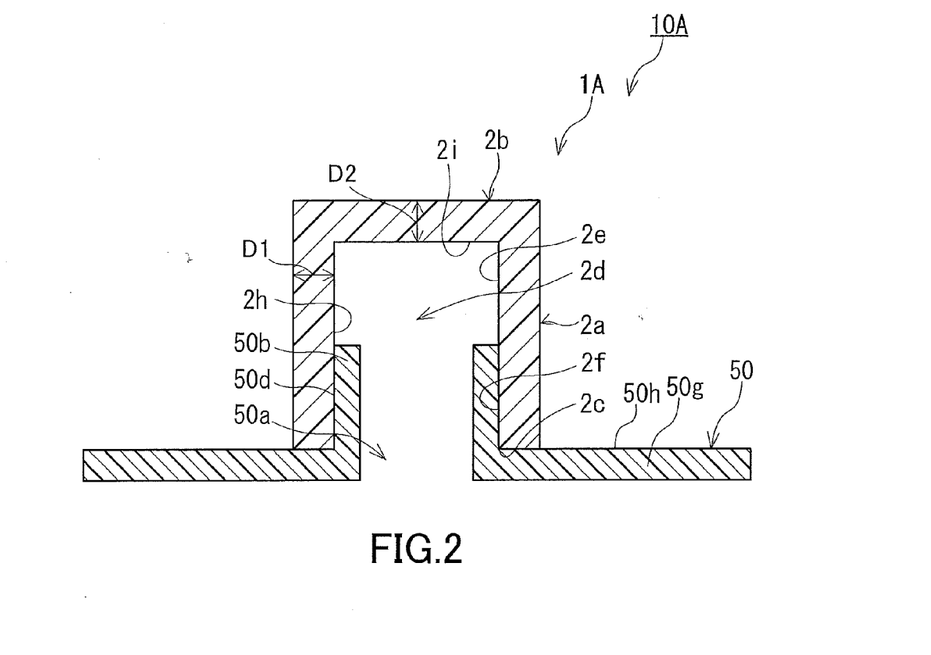
FIG. 2 is a cross-sectional view of a ventilation structure according to the first embodiment of the present invention.

FIG. 1 shows a ventilation member 1A according to the first embodiment of the present invention, and FIG. 2 shows a ventilation structure 10A according to the first embodiment of the present invention. The ventilation structure 10A includes a housing 50 having an opening portion 50a and the ventilation member 1A formed of a porous resin and attached to the housing 50 so as to cover the opening portion 50a. A wall portion 50g of the housing 50 separates the space inside the housing 50 from the space outside the housing 50. The opening portion 50a is a through hole penetrating the wall portion 50g to allow communication between the space inside the housing 50 and the space outside the housing 50. The housing 50 has a cylindrical projecting portion 50b projecting outwardly from the outer surface 50h of the wall portion 50g so as to surround the peripheral edge of the opening portion 50a. The wall portion 50g and the projecting portion 50b are integrally formed of a gas-impermeable material.

The ventilation member 1A includes a cylindrical recessed portion 2d having a circular opening 2c and a side wall portion 2a defining a side surface (i.e., the inner surface) 2h of the recessed portion 2d. The side wall portion 2a is fitted to the side surface (i.e., the outer surface) 50d of the projecting portion 50b, with at least one of the projecting portion 50b and the side wall portion 2a being elastically deformed. In the present embodiment, for example, the ventilation member 1A having the side wall portion 2a with an inner diameter slightly smaller than the outer diameter of the projecting portion 50b is prepared and the projecting portion 50b is press-fitted to the side wall portion 2a. Thus, the side wall portion 2a is fitted to the projecting portion 50b, with the side wall portion 2a being elastically deformed outwardly. Since the inwardly-biased side wall portion 2a is fitted to the side surface 50d, the inner surface 2h of the side wall portion 2a and the outer surface 50d of the projecting portion 50b are in close contact with each other. Therefore, it is possible to prevent water or the like from entering the space inside the housing 50 from the space outside the housing 50. In the embodiment shown in FIG. 2, the inner surface 2h and the outer surface 50d are in direct contact with each other. However, the present invention is not limited to this embodiment. Entry of water or the like may be prevented more reliably by applying an adhesive agent between the projecting portion 50b and the side wall portion 2a. The above description is based on the premise that only the side wall portion 2a is elastically deformed. However, the ventilation member 1A may be attached to the housing 50, with only the projecting portion 50b being elastically deformed inwardly, or with both the side wall portion 2a and the projecting portion 50b being elastically deformed.

The ventilation member 1A is a bottomed tubular member including the bottom wall portion 2b and the side wall portion 2a that are formed integrally. The shape of the ventilation member 1A is not limited to this. For example, an upper portion of the side wall portion 2a that is not in contact with the projecting portion 50 may be inclined and have an inverted V-shaped cross section. In this case, the ventilation member 1A has no bottom wall portion 2b in shape.

The side surface (i.e., the inner surface) 2h of the side wall portion 2a has a non-contact surface 2e that is not in contact with the side surface (i.e., the outer surface) 50d of the projecting portion 50b and a contact surface 2f that is in contact with the side surface 50d. The non-contact surface 2e is located in the upper part of the side wall portion 2a in this figure and leads to the disk-shaped bottom wall portion 2b defining the bottom surface 2i of the recessed portion 2d. The contact surface 2f is located in the lower part of the side wall portion 2a in this figure and leads to the opening 2c. The non-contact surface 2e and the bottom surface 2i define the area of a gas passage in the ventilation member 1A communicating with the space inside the housing 50. The presence of the non-contact surface 2e improves the gas permeability of the ventilation structure 10A, compared to the case where the entire side surface 2h of the side wall portion 2a is the contact surface 2f.

Since the ventilation member 1A is formed of a porous resin, the ventilation member 1A itself serves as a gas passage. The bottom wall portion 2b and the side wall portion 2a are configured to allow a gas to pass through between their inner surfaces facing the recessed portion 2d and their outer surfaces opposite to the inner surfaces. In the ventilation structure 10A, the bottom wall portion 2b of the ventilation member 1A and the upper part of the side wall portion 2a thereof forming the non-contact surface 2e serve as a main gas passage. The lower part of the side wall portion 2a forming the contact surface 2f also serves as a longish gas passage leading to the non-contact surface 2e.

Figure 3:
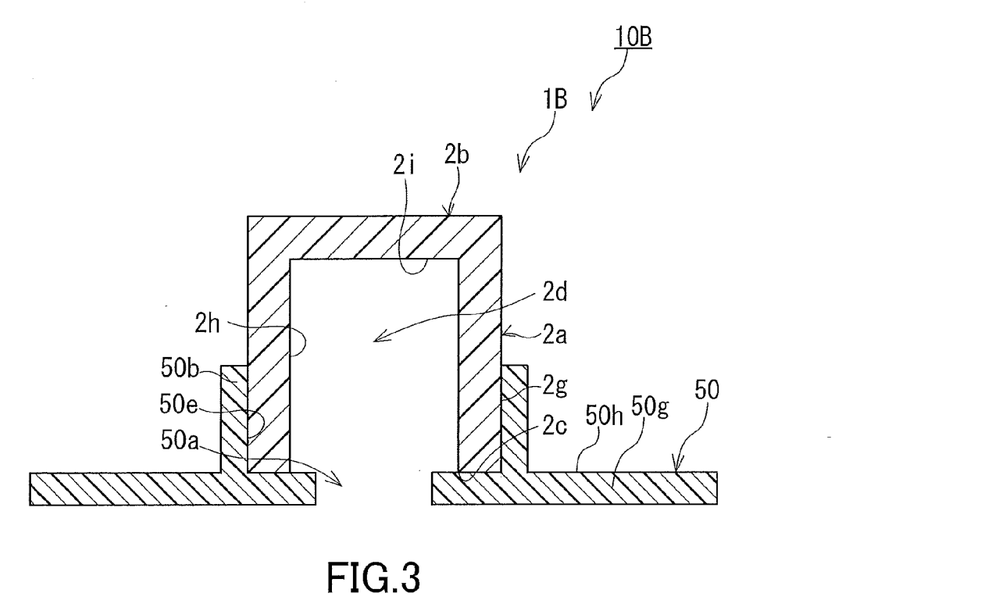
FIG. 3 is a cross-sectional view of a ventilation structure according to a modification of the present invention.
Figure 4:
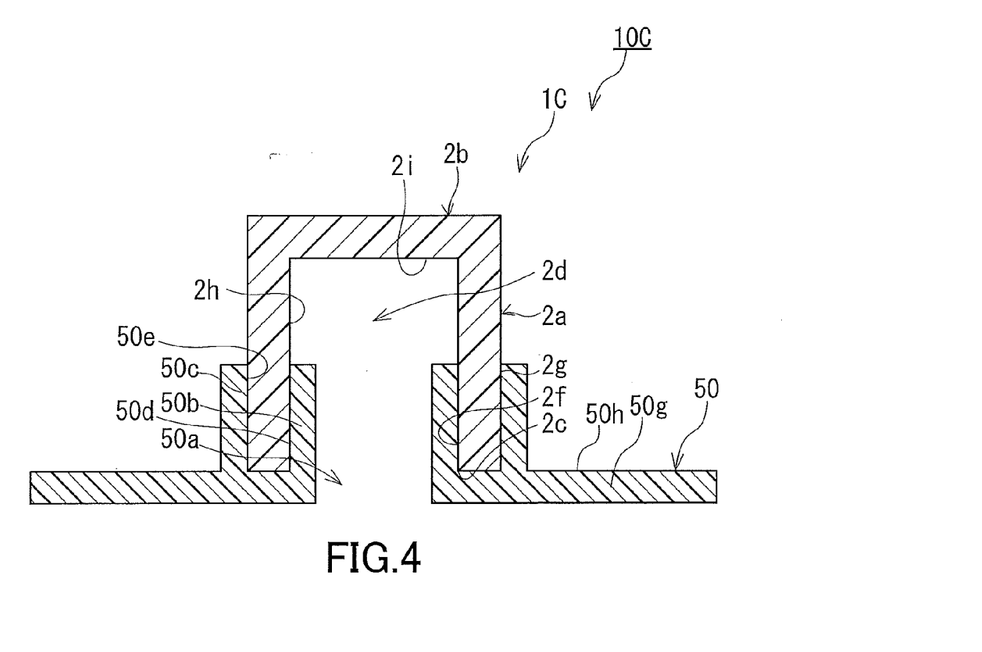
FIG. 4 is a cross-sectional view of a ventilation structure according to another modification of the present invention.

FIG. 3 and FIG. 4 each show another ventilation structure using the same ventilation member as the ventilation member 1A. In a ventilation structure 10B shown in FIG. 3, the outer surface 2g of the side wall portion 2a of a ventilation member 1B is in contact with the inner surface 50e of the projecting portion 50b of the housing 50. Furthermore, in a ventilation structure 10C shown in FIG. 4, the housing 50 has another cylindrical projecting portion 50c projecting from the outer surface 50h of the housing 50 so as to surround the projecting portion 50b. The side wall portion 2a is inserted between the outer surface 50d of the projecting portion 50b and the inner surface 50e of the projecting portion 50c, and thus the ventilation member 1C is attached to the housing 50. When the ventilation member 1C is attached in this manner, the inner surface 2f of the side wall portion 2a is in contact with the outer surface 50d of the inside projecting portion 50b, and the outer surface 2g of the side wall portion 2a is in contact with the inner surface 50e of the outside projecting portion 50c. The ventilation member 1C having the side wall portion 2a with a thickness slightly larger than the distance between the side surface 50d of the projecting portion 50b and the side surface 50e of the projecting portion 50c is prepared and the side wall portion 2a is press-fitted between the projecting portion 50b and the projecting portion 50c. Thus, the side wall portion 2a is fitted between the side surface 50d and the side surface 50e. In these embodiments, the lower end surface of the side wall portion 2a is in contact with the outer surface 50h of the housing 50. However, the ventilation structure may be configured in such a manner that the lower end surface of the side wall portion 2a is spaced from the outer surface 50h of the housing 50.

It is preferable that the side wall portion 2a and the bottom wall portion 2b of the ventilation member 1A be integrally formed of a porous resin. Therefore, the side wall portion 2a and the bottom wall portion 2b are not members that are separately formed and joined together but they are each a part of a single member formed of a porous resin. However, the ventilation member 1A may include another optional member joined thereto. The porous resin forming the ventilation member 1A is a porous molded body composed of resin fine particles that are bound together. Preferably, the porous resin molded body has a porosity of 20 to 90%. The resin is not particularly limited, and it is preferably ultra-high molecular weight polyethylene. As used herein, the term "ultra-high molecular weight polyethylene" refers to a polyethylene having an average molecular weight of 500000 or more. The average molecular weight of ultra-high molecular weight polyethylene is generally in the range of 2000000 to 10000000. The average molecular weight can be measured, for example, by a method according to ASTM D 4020 (viscosity test). Hereinafter, ultra-high molecular weight polyethylene is abbreviated to "UHMWPE".

The porous UHMWPE resin molded body can be produced from a sintered body of UHMWPE powder. The sintered body of UHMWPE powder can be obtained by sintering UHMWPE powder (for example, an UHMWPE powder with an average particle diameter of 30 to 200 μm) placed in a mold at a temperature close to the melting point of UHMWPE (for example, a temperature of 130 to 160° C.). The ventilation member 1A formed of the porous UHMWPE resin molded body is obtained by using a mold of a desired shape for a sintered body or by cutting a sintered body block thus obtained into a desired shape. According to this production method (powder sintering method), the resulting porous UHMWPE resin molded body has a porosity in the range of 20 to 90%.

The surface of the ventilation member 1A may be subjected to liquid-repellent treatment. The liquid-repellent treatment can be carried out by a commonly-known method. The liquid-repellent agent used for the liquid-repellent treatment is not particularly limited, and it is typically a material containing a polymer having a perfluoroalkyl group. Examples of the method for forming a coating film containing a polymer having a perfluoroalkyl group include: coating methods in which coating with a solution or a dispersion of a polymer having a perfluoroalkyl group is performed by air spraying, electrostatic spraying, dip coating, spin coating, roll coating (including kiss coating and gravure coating), curtain flow coating, impregnation, or the like; and coating film forming methods using electrodeposition coating or plasma polymerization.

As shown in FIG. 2, the thickness of the ventilation member 1A (i.e., the thickness D1 of the side wall portion 2a and the thickness D2 of the bottom wall portion 2b) is desirably 0.2 mm or more and 20 mm or less, preferably 0.3 mm or more and 10 mm or less, more preferably 0.5 mm or more and 10 mm or less, even more preferably 1 mm or more and 5 mm or less, and particularly preferably 1.5 mm or more and 5 mm or less. In the present embodiment, the thickness D1 of the side wall portion 2a is equal to the thickness D2 of the bottom wall portion 2b, but the thicknesses D1 and D2 may be different from each other.

Second Embodiment

Next, a ventilation member 1D and a ventilation structure 10D according to the second embodiment of the present invention will be described with reference to FIG. 5 and FIG. 6.

The ventilation structure 10D includes the housing 50 having the opening portion 50a and the ventilation member 1D formed of a porous resin and attached to the housing 50 so as to cover the opening portion 50a. In the ventilation structure 10D, the ventilation member 1D is fitted to the side surface 50f of the wall portion 50g of the housing 50 facing the opening portion 50a, with at least one of the wall portion 50g and the ventilation member 1D being elastically deformed.

The ventilation member 1D includes a cylindrical fitting portion 3a adapted to be fitted in the circular opening portion 50a and a cylindrical flange portion 3b having an outer diameter greater than that of the fitting portion 3a. The fitting portion 3a is fitted to the side surface 50f facing the opening portion 50a, with at least one of the wall portion 50g and the fitting portion 3a being elastically deformed. In the present embodiment, for example, the ventilation member 1D having the fitting portion 3a with an outer diameter slightly greater than the inner diameter of the opening portion 50a is prepared and the fitting portion 3a is press-fitted into the opening portion 50a. Thus, the ventilation member 1D is fitted to the side wall 50f, with the fitting portion 3a being elastically deformed inwardly. The above description is based on the premise that only the fitting portion 3a is elastically deformed. However, the ventilation member 1D may be attached to the housing 50, with only the wall portion 50g being elastically deformed outwardly, or with both the fitting portion 3a and the wall portion 50g being elastically deformed. Also in the present embodiment, the side surface of the fitting portion 3a and the side surface of the wall portion 50g are in close contact with each other by a biasing force produced by the elastic deformation, and thus entry of water or the like from the outside space can be prevented. Also in the present embodiment, an adhesive agent may be applied therebetween.

The side surface of the fitting portion 3a has a contact surface 3h and a non-contact surface 3i, and when the ventilation member 1D is attached to the housing 50 so as to cover the opening portion 50a, the contact surface 3h is in contact with the side surface 50f but the non-contact surface 3i is not in contact with the side surface 50f. The contact surface 3h is located in the upper part of the fitting portion 3a in this figure and leads to the lower end surface of the flange portion 3b. The non-contact surface 3i is located in the lower part of the fitting portion 3a in this figure and leads to the lower end surface of the fitting portion 3a projecting into the space inside the housing 50. The ventilation member 1D is attached to the housing 50 in such a manner that the lower end surface of the flange portion 3b is in contact with the outer surface 50h of the housing 50. The fitting portion 3a and the flange portion 3b are both cylindrical solid members. The outer diameter of the flange portion 3b is greater than that of the fitting portion 3a, and the central axis of the flange portion 3b coincides with that of the fitting portion 3a. The length of the fitting portion 3a may be reduced to prevent the fitting portion 3a from projecting into the space inside the housing 50 and thus to remove the non-contact surface 3i. A sealing member such as an O-ring may be interposed between the lower end surface of the flange portion 3b and the outer surface 50h of the housing 50.

Since the ventilation member 1D is formed of a porous resin, the ventilation member 1D itself serves as a gas passage. The fitting portion 3a and the flange portion 3b are themselves gas permeable in any direction. In the ventilation member 1D, the fitting portion 3a and a portion of the flange portion 3b located above the fitting portion 3a serve as a main gas passage. The outer peripheral portion of the flange portion 3b also serves as a longish gas passage leading to the side surface of the like.

The thickness D3 of the ventilation member 1D in the attachment direction is desirably 5 mm or more and 50 mm or less, and preferably 8 mm or more and 30 mm or less. The thickness D4 of the flange portion 3b in the attachment direction is desirably 0.2 mm or more and 10 mm or less, and preferably 0.3 mm or more and 5 mm or less.

In the ventilation member 1D, at least the fitting portion 3a and the flange portion 3b are integrally formed of a gas-permeable porous resin. The ventilation member 1D may include another optional member joined thereto. The porous resin is, for example, a porous molded body composed of ultra-high molecular weight polyethylene fine particles that are bound together. It is preferable that the surface of the ventilation member 1D be subjected to liquid-repellent treatment.

Figure 7:
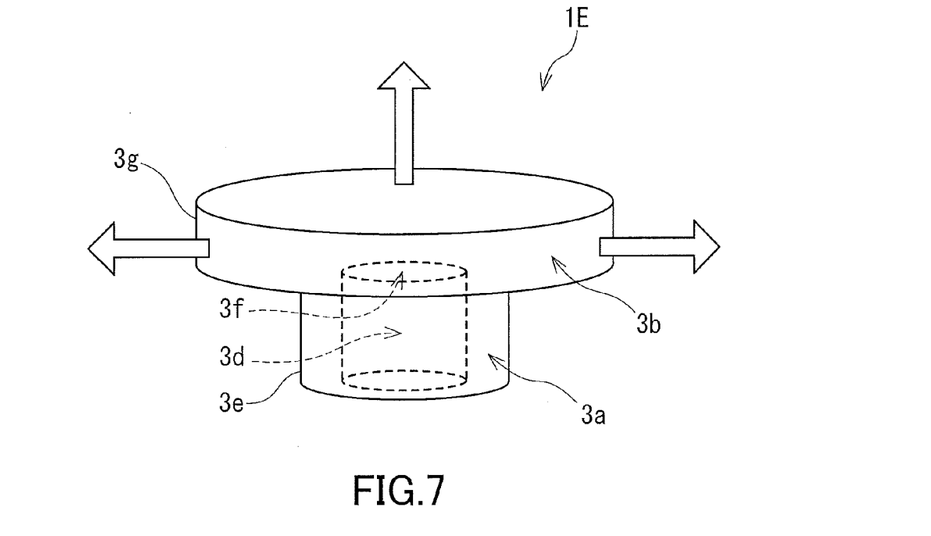
FIG. 7 is a perspective view of a ventilation member according to a modification of the present invention.
Figure 8:
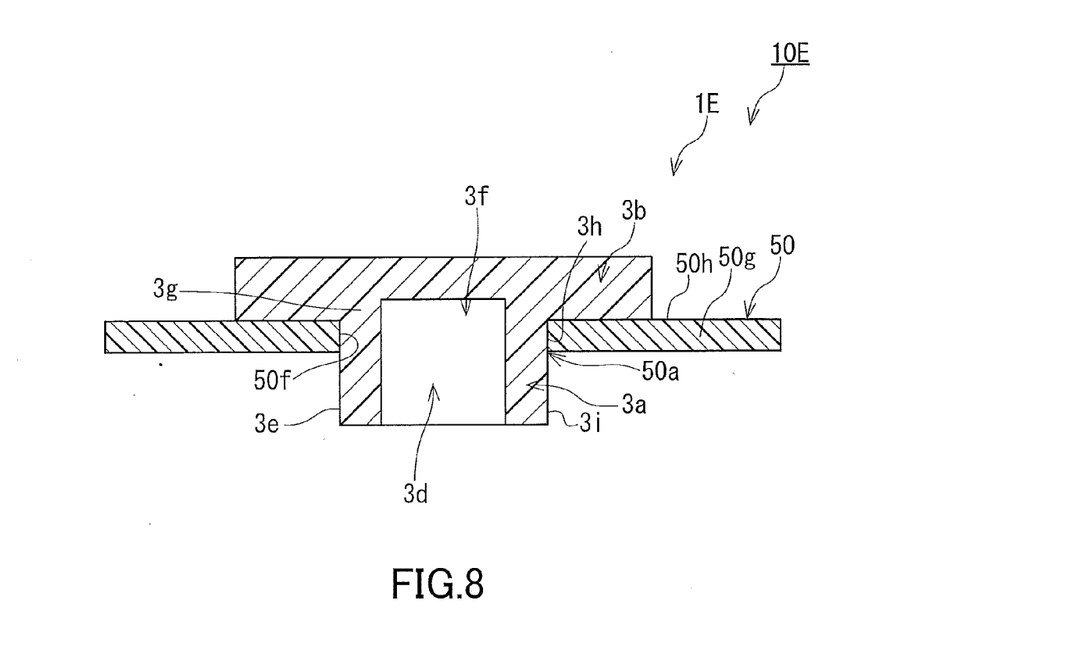
FIG. 8 is a cross-sectional view of a ventilation structure according to the modification of the present invention.
Figure 9:
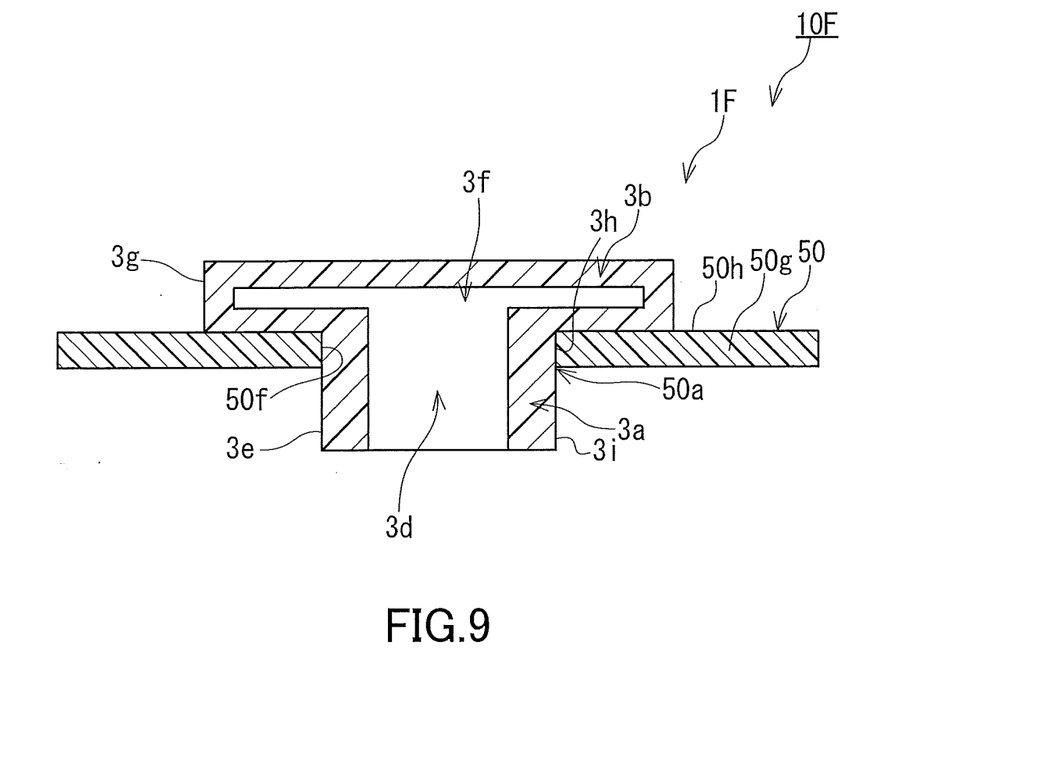
FIG. 9 is a cross-sectional view of a ventilation structure according to another modification of the present invention.

In the present embodiment, the fitting portion 3a and the flange portion 3b are both solid members. However, as shown in FIG. 7 to FIG. 9, the fitting portion 3a and the flange portion 3b may be hollow members having a through hole and a recessed portion, respectively. Although not shown in the figure, only the fitting portion 3a may be a hollow member having a recessed portion.

As shown in FIG. 7 and FIG. 8, the fitting portion 3a of the ventilation member 1E has a through hole 3d and a first wall portion 3e formed to surround the through hole 3d. The first wall portion 3e is configured to allow a gas to pass through between its inner surface facing the through hole 3d and its outer surface opposite to the inner surface. The flange portion 3b has a recessed portion 3f communicating with the through hole 3d and a second wall portion 3g formed to surround the recessed portion 3f. The second wall portion 3g is configured to allow a gas to pass through between its inner surface facing the recessed portion 3f and its outer surface opposite to the inner surface. The through hole 3d is a through hole penetrating the fitting portion 3a to form a cylindrical space therein. The recessed portion 3f is a recessed portion forming a cylindrical recess in the flange portion 3b. The central axes of the through hole 3d and the recessed portion 3f coincide with those of the fitting portion 3a and the flange portion 3b. The inner diameter of the recessed portion 3f is equal to that of the through hole 3d. The through hole 3d and the recessed portion 3f may be formed by injection molding or cutting.

In a ventilation structure 10F, as shown in FIG. 9, the flange portion 3b of a ventilation member 1F has the recessed portion 3f with a different shape. Specifically, the recessed portion 3f is radially extended so that the recessed portion 3f has an inner diameter greater than that of the through hole 3d.

Hereinafter, the present invention will be described in more detail with reference to examples. However, the present invention is not limited to the examples described below.

Example 1

A porous UHMWPE resin molded body (with a porosity of 37%) was cut to obtain a ventilation member having the shape shown in FIG. 1 and FIG. 2 and the following dimensions: the outer diameter of the ventilation member: 12 mm; the inner diameter of the recessed portion: 8 mm; the length of the ventilation member in the attachment direction: 12 mm; the length of the recessed portion in the attachment direction: 10 mm; the thickness of the side wall portion: 2 mm; and the thickness of the bottom wall portion: 2 mm. Teflon (registered trademark) AF-2400 (manufactured by Du Pont) was dissolved in a diluent (Fluorinert (registered trademark) FC-43) (manufactured by Sumitomo 3M Limited) to obtain a 3.0 wt % solution. Thus, a liquid-repellent treatment solution was prepared. This liquid-repellent treatment solution was maintained at 20° C., and the ventilation member was immersed in this solution for about 5 seconds. Then, the ventilation member was left at room temperature for about 1 hour for drying. Thus, a liquid-repellent ventilation member was obtained. An ECU box (with a capacity of 60000 $cm^3$) as a housing having the shape shown in FIG. 2 and having the projecting portion with an outer diameter of 8.5 mm and an inner diameter of 4.5 mm was prepared. The ventilation member thus obtained was fitted to the projecting portion of the ECU box in such a manner as shown in FIG. 2, with the ventilation member being elastically deformed. In this case, the gas permeable volume of the ventilation member (the total volume of the side wall portion and the bottom wall portion) was 855 $cm^3$, and the gas permeation rate at a differential pressure of 1 kPa was 3878 $cm^3$/kPa/min as measured with a flow meter. When this ECU box was subjected to a temperature change from −40° C. to 125° C. over 1 hour, the maximum differential pressure was 0.180 kPa.

Example 2

Figure 5:
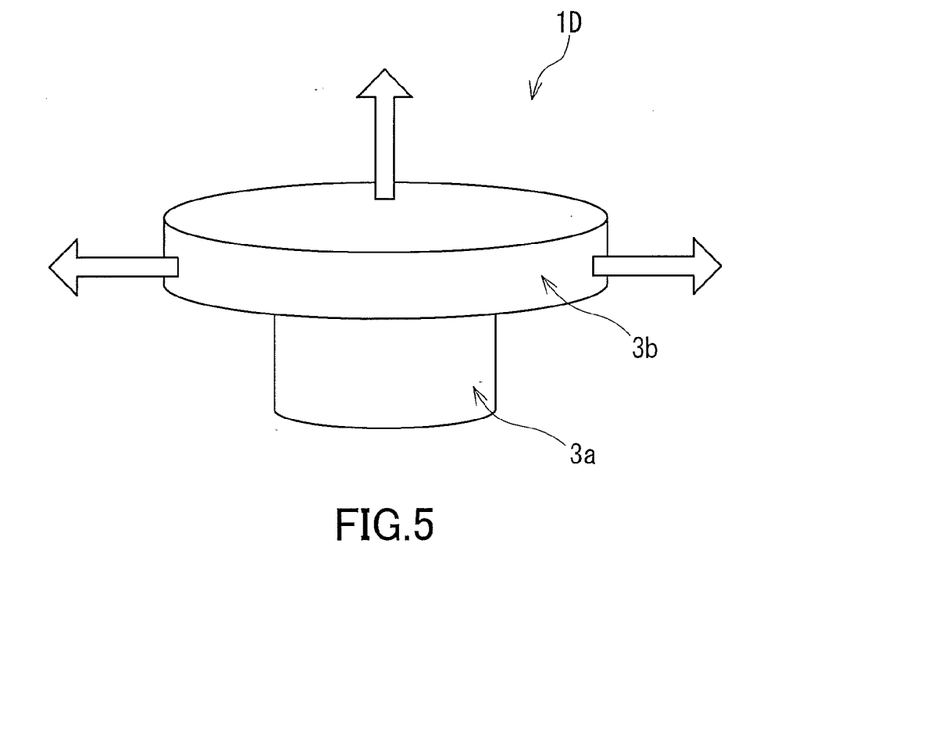
FIG. 5 is a perspective view of a ventilation member according to a second embodiment of the present invention.
Figure 6:
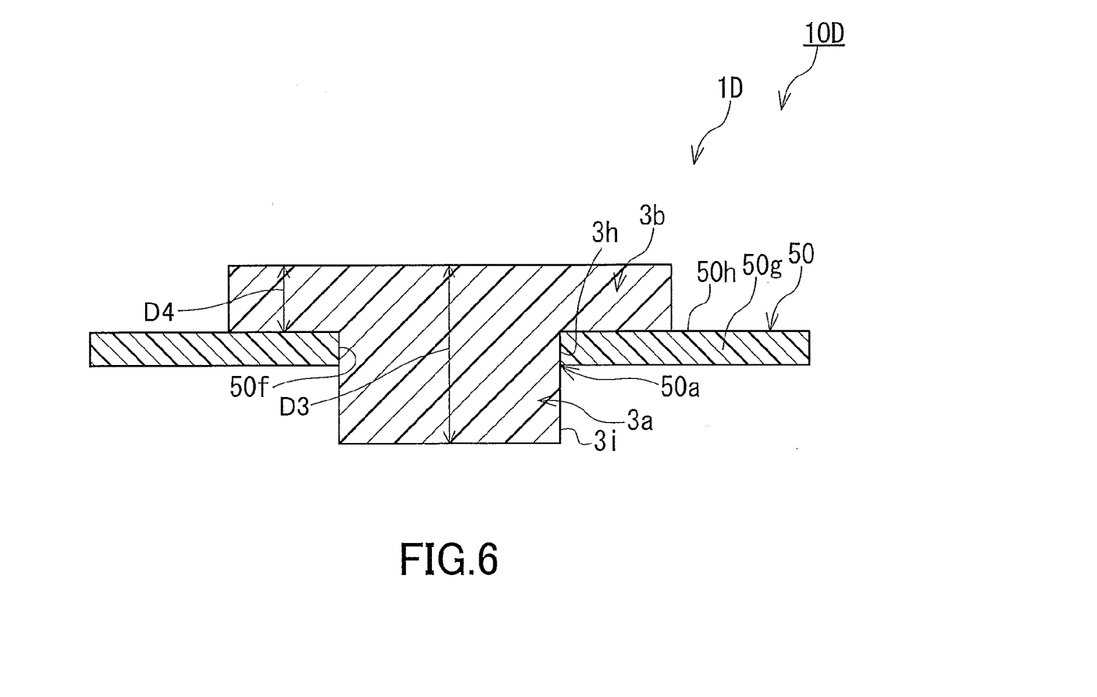
FIG. 6 is a cross-sectional view of a ventilation structure according to the second embodiment of the present invention.

A porous UHMWPE resin molded body was cut to obtain a ventilation member having the shape shown in FIG. 5 and FIG. 6 and the following dimensions: the outer diameter of the flange portion: 20 mm; the outer diameter of the fitting portion: 10.6 mm; the thickness of the flange portion in the attachment direction: 3 mm; the thickness of the fitting portion in the attachment direction: 5 mm; and the thickness of the ventilation member in the attachment direction: 8 mm. Teflon (registered trademark) AF-2400 was dissolved in a diluent (Fluorinert (registered trademark) FC-43) to obtain a 3.0 wt % solution. Thus, a liquid-repellent treatment solution was prepared. This liquid-repellent treatment solution was maintained at 20° C., and the ventilation member was immersed in this solution for about 5 seconds. Then, the ventilation member was left at room temperature for about 1 hour for drying. Thus, a liquid-repellent ventilation member was obtained. An ECU box (with a capacity of 60000 cm$^3$) as a housing having the shape shown in FIG. 6 and having the opening portion with an inner diameter of 10.4 mm was prepared. The ventilation member thus obtained was fitted in the opening portion of the ECU box in such a manner as shown in FIG. 6, with the ventilation member being elastically deformed. In this case, the gas permeable volume of the ventilation member (the total volume of the fitting portion and the flange portion) was 1335 cm$^3$, and the gas permeation rate at a differential pressure of 1 kPa was 6000 cm$^3$/kPa/min. When this ECU box was subjected to a temperature change from −40° C. to 125° C. over 1 hour, the maximum differential pressure was 0.117 kPa.

Comparative Example 1

TEMISH (registered trademark) Capseal (C2-NTF9208-L01) manufactured by Nitto Denko Corporation as shown in FIG. 11 was prepared as a ventilation member. An ECU box (with a capacity of 60000 cm$^3$) as a housing having the shape shown in FIG. 11 and having the projecting portion with an outer diameter of 8.5 mm and an inner diameter of 4.5 mm was prepared. The tubular body of this ventilation member was fitted to the projecting portion of the ECU box in such a manner as shown in FIG. 11, with the ventilation member being elastically deformed. In this case, the gas permeable volume of the ventilation member (the total volume of the gas passage) was 5.72 cm$^3$, and the gas permeation rate at a differential pressure of 1 kPa was 1500 cm$^3$/kPa/min. When this ECU box was subjected to a temperature change from −40° C. to 125° C. over 1 hour, the maximum differential pressure was 0.46 kPa.

Comparative Example 2

TEMISH (registered trademark) Z3-NTF210SE manufactured by Nitto Denko Corporation as shown in FIG. 13 was prepared as a ventilation member. An ECU box (with a capacity of 60000 cm$^3$) as a housing having the shape shown in FIG. 13 and having the opening portion with an inner diameter of 10.4 mm was prepared. The ventilation member thus obtained was fitted in the opening portion of the ECU box in such a manner as shown in FIG. 13, with the leg portions of the ventilation member being elastically deformed. In this case, the gas permeable volume of the ventilation member (the total volume of the gas passage) was 11.3 cm$^3$, and the gas permeation rate at a differential pressure of 1 kPa was 100 cm$^3$/kPa/min. When this ECU box was subjected to a temperature change from −40° C. to 125° C. over 1 hour, the maximum differential pressure was 5.88 kPa.

INDUSTRIAL APPLICABILITY

The waterproof ventilation member according to the present invention can be applied also to housings other than housings of automobile electric components. For example, the present invention can be applied also to housings of OA equipment, household electric appliances, and medical devices.

The invention claimed is:

1. A ventilation structure comprising:
    a housing having an opening portion; and
    a ventilation member formed of a porous resin and attached to the housing so as to cover the opening portion, the ventilation member comprising a tubular portion, a first wall forming the tubular portion being configured so as to allow gas to pass through the first wall by passing through the pores of the porous resin of the first wall, wherein
    the ventilation member is fitted to a side surface of a wall portion of the housing facing the opening portion or to a side surface of a projecting portion provided on an outer surface of the wall portion, with at least one of the wall portion, the projecting portion, and the ventilation member being elastically deformed.

2. The ventilation structure according to claim 1, wherein
    the ventilation member comprises: a recessed portion having an opening; and a side wall portion defining a side surface of the recessed portion, and
    the side wall portion is fitted to the side surface of the projecting portion, with at least one of the projecting portion and the side wall portion being elastically deformed.

3. The ventilation structure according to claim 2, wherein a side surface of the side wall portion has a contact surface that is in contact with the side surface of the projecting portion and a non-contact surface that is not in contact with the side surface of the projecting portion.

4. The ventilation structure according to claim 1, wherein
    the ventilation member comprises: a fitting portion fitted in the opening portion; and a flange portion formed integrally with the fitting portion and having an outer diameter greater than an outer diameter of the fitting portion, and
    the fitting portion is fitted to the side surface facing the opening portion, with at least one of the wall portion and the fitting portion being elastically deformed.

5. The ventilation structure according to claim 4, wherein
    the fitting portion comprises: a through hole; and a first wall portion formed to surround the through hole and having an inner surface facing the through hole and an outer surface opposite to the inner surface, the first wall portion being configured to allow a gas to pass through between the inner surface and the outer surface, and
    the flange portion comprises: a recessed portion communicating with the through hole; and a second wall portion formed to surround the recessed portion and having an inner surface facing the recessed portion and an outer surface opposite to the inner surface, the second wall portion being configured to allow a gas to pass through between the inner surface and the outer surface.

6. The ventilation structure according to claim 1, wherein a surface of the ventilation member is subjected to liquid-repellent treatment.

7. The ventilation structure according to claim 1, wherein the porous resin is a porous molded body composed of resin fine particles that are bound together.

8. The ventilation structure according to claim 1, wherein the ventilation member has a thickness of 0.2 mm or more and 20 mm or less.

9. The ventilation structure according to claim 1, wherein the porous resin has a porosity of 20% or more and 90% or less.

10. A ventilation member adapted to be attached to a housing so as to cover an opening portion of the housing, the ventilation member being formed of a porous resin and comprising a contact surface, the ventilation member comprising a tubular portion, a first wall forming the tubular portion being configured so as to allow gas to pass through the first wall by passing through the pores of the porous resin of the first wall, wherein
when the ventilation member is attached to the housing so as to cover the opening portion, the contact surface is in contact with a side surface of a wall portion of the housing facing the opening portion or with a side surface of a projecting portion provided on an outer surface of the wall portion, with at least one of the wall portion, the projecting portion, and the ventilation member being elastically deformed.

11. The ventilation member according to claim 10, comprising: a recessed portion having an opening; and a side wall portion defining a side surface of the recessed portion, wherein
the side wall portion has the contact surface, and
when the ventilation member is attached to the housing so as to cover the opening portion, the contact surface is in contact with the side surface of the projecting portion, with at least one of the projecting portion and the side wall portion being elastically deformed.

12. The ventilation member according to claim 10, comprising: a fitting portion adapted to be fitted in the opening portion; and a flange portion formed integrally with the fitting portion and having an outer diameter greater than an outer diameter of the fitting portion, wherein
the fitting portion has the contact surface, and
when the ventilation member is attached to the housing so as to cover the opening portion, the contact surface is in contact with the side surface facing the opening portion, with at least one of the wall portion and the fitting portion being elastically deformed.

13. The ventilation member according to claim 10, wherein the porous resin is a porous molded body composed of resin fine particles that are bound together.

14. The ventilation member according to claim 10, wherein the ventilation member has a thickness of 0.2 mm or more and 20 mm or less.

15. The ventilation member according to claim 10, wherein the porous resin has a porosity of 20% or more and 90% or less.

16. The ventilation structure according to claim 1, wherein
the ventilation member comprises a bottom portion, a second wall forming the bottom portion being configured so as to allow gas to pass through the second wall by passing through the pores of the porous resin of the second wall, and
the tubular portion and the bottom portion are formed integrally.

17. The ventilation member according to claim 10, wherein
the ventilation member comprises a bottom portion, a second wall forming the bottom portion being configured so as to allow gas to pass through the second wall by passing through the pores of the porous resin of the second wall, and
the tubular portion and the bottom portion are formed integrally.

* * * * *